(12) United States Patent
Kim et al.

(10) Patent No.: US 9,355,963 B2
(45) Date of Patent: May 31, 2016

(54) SEMICONDUCTOR PACKAGE INTERCONNECTIONS AND METHOD OF MAKING THE SAME

(71) Applicant: QUALCOMM Incorporated, San Diego, CA (US)

(72) Inventors: Dong Wook Kim, San Diego, CA (US); Jae Sik Lee, San Diego, CA (US); Hong Bok We, San Diego, CA (US); Young Kyu Song, San Diego, CA (US); Chin-Kwan Kim, San Diego, CA (US); Kyu-Pyung Hwang, San Diego, CA (US); Shiqun Gu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/498,076

(22) Filed: Sep. 26, 2014

(65) Prior Publication Data

US 2016/0093571 A1    Mar. 31, 2016

(51) Int. Cl.
*H01L 23/538* (2006.01)
*H01L 21/48* (2006.01)
*H01L 21/56* (2006.01)

(52) U.S. Cl.
CPC .......... *H01L 23/5389* (2013.01); *H01L 21/486* (2013.01); *H01L 21/56* (2013.01)

(58) Field of Classification Search
CPC .................................................. H01L 23/498
See application file for complete search history.

(56) References Cited

U.S. PATENT DOCUMENTS

| | | | |
|---|---|---|---|
| 7,208,826 B2 | 4/2007 | Sakamoto et al. | |
| 7,402,901 B2 | 7/2008 | Hatano et al. | |
| 8,039,303 B2 * | 10/2011 | Shim, II | H01L 21/568 257/100 |
| 8,288,854 B2 | 10/2012 | Weng et al. | |
| 8,368,216 B2 | 2/2013 | Lai et al. | |
| 8,368,230 B2 | 2/2013 | Koide | |
| 2004/0178495 A1* | 9/2004 | Yean | H01L 23/5389 257/723 |
| 2010/0013101 A1 | 1/2010 | Hedler et al. | |
| 2011/0285006 A1* | 11/2011 | Weng | H01L 23/13 257/686 |
| 2012/0056316 A1 | 3/2012 | Pagaila et al. | |
| 2013/0069239 A1* | 3/2013 | Kim | H01L 23/49827 257/774 |
| 2014/0077364 A1* | 3/2014 | Marimuthu | H01L 23/5389 257/737 |
| 2014/0084478 A1* | 3/2014 | Simion | B29C 37/0075 257/774 |
| 2015/0228556 A1* | 8/2015 | Lee | H01L 23/481 257/774 |
| 2015/0270232 A1* | 9/2015 | Chen | H01L 24/02 257/691 |
| 2015/0270247 A1* | 9/2015 | Chen | H01L 25/0655 257/738 |
| 2015/0325496 A1* | 11/2015 | Alvarado | H01L 23/481 257/774 |

FOREIGN PATENT DOCUMENTS

JP          2010118589 A       5/2010

OTHER PUBLICATIONS

International Search Report and Written Opinion—PCT/US2015/052217—ISA/EPO—Jan. 8, 2016.

* cited by examiner

*Primary Examiner* — Lex Malsawma
(74) *Attorney, Agent, or Firm* — Muncy, Geissler, Olds & Lowe, P.C.

(57) ABSTRACT

A semiconductor package according to some examples of the disclosure may include a base with a first redistribution layer on one side, first and second side by side die attached to the base on an opposite side from the first redistribution layer, an interposer attached to active sides of the first and second die to provide an interconnection between the first and second die, a plurality of die vias extending from the first and second die to a second redistribution layer on a surface of the package opposite the first redistribution layer, and a plurality of package vias extending through the package between the first and second redistribution layers.

30 Claims, 3 Drawing Sheets

SEMICONDUCTOR PACKAGE INTERCONNECTIONS AND METHOD OF MAKING THE SAME

FIELD OF DISCLOSURE

This disclosure relates generally to semiconductor packages, and more specifically, but not exclusively, to semiconductor package interconnections.

BACKGROUND

Conventionally, semiconductor packages for side by side or split die require a redistribution layer (RDL) or bridge interposer embedded in the package substrate for interconnecting the side by side dies. Because of placement errors encountered during the placement of the side by side dies on the package substrate, landing pads are necessary to align the dies with the RDL interconnections or interposer embedded in the substrate. Since the placement errors typically encountered are 10 µm or greater, large width landing pads for the embedded RDL interconnections are required. These landing pads are 80 µm wide or larger. With such large landing pads, the line/spacing (L/S) of the interconnection routings of the RDL between the landing pads is necessarily large as well. Large L/S interconnections result in more congestion in the routing distribution and larger chips to accommodate the required routing. With the trend towards smaller, less congested semiconductor packages, large L/S interconnections are not desirable.

Accordingly, there is a need for semiconductor interconnections and methods for making the interconnections that improve upon conventional methods including the improved methods and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a semiconductor package that includes a base having a first side and a second side opposite the first side; a first redistribution layer on the first side of the base, the first redistribution layer configured to couple the base with an external device; a first die attached to the second side of the base with an active side of the first die facing away from the base; a second die attached to the second side of the base adjacent the first die with an active side of the second die facing away from the base; an interposer attached to the active side of the first die and the active side of the second die; an encapsulation layer encapsulating the second side of the base, the first die, the second die, and the interposer; a first plurality of vias coupled to the first die; a second plurality of vias coupled to the second die, the first plurality of vias and the second plurality of vias extending partially through the encapsulation layer; and a third plurality of vias extending through the encapsulation layer and the base.

In some examples of the disclosure, the system, apparatus, and method includes forming a base with a first side and a second side opposite the first side, the base having a first redistribution layer on the first side of the base configured to provide a connection from the first side to the second side; attaching a first die to the second side of the base with an active side of the first die facing away from the base; attaching a second die to the second side of the base adjacent the first die with an active side of the second die facing away from the base; attaching an interposer to the active sides of the first die and the second die to interconnect the first die and the second die; applying a encapsulating material to encapsulate the second side of the base, the first die, the second die, and the interposer, the encapsulating material and base forming a package substrate; forming a first plurality of vias extending partially through the encapsulating material to provide external connections to the first die; forming a second plurality of vias extending partially through the encapsulating material to provide external connections to the second die; and forming a third plurality of vias extending through the encapsulating material and the base.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

Figure 1:
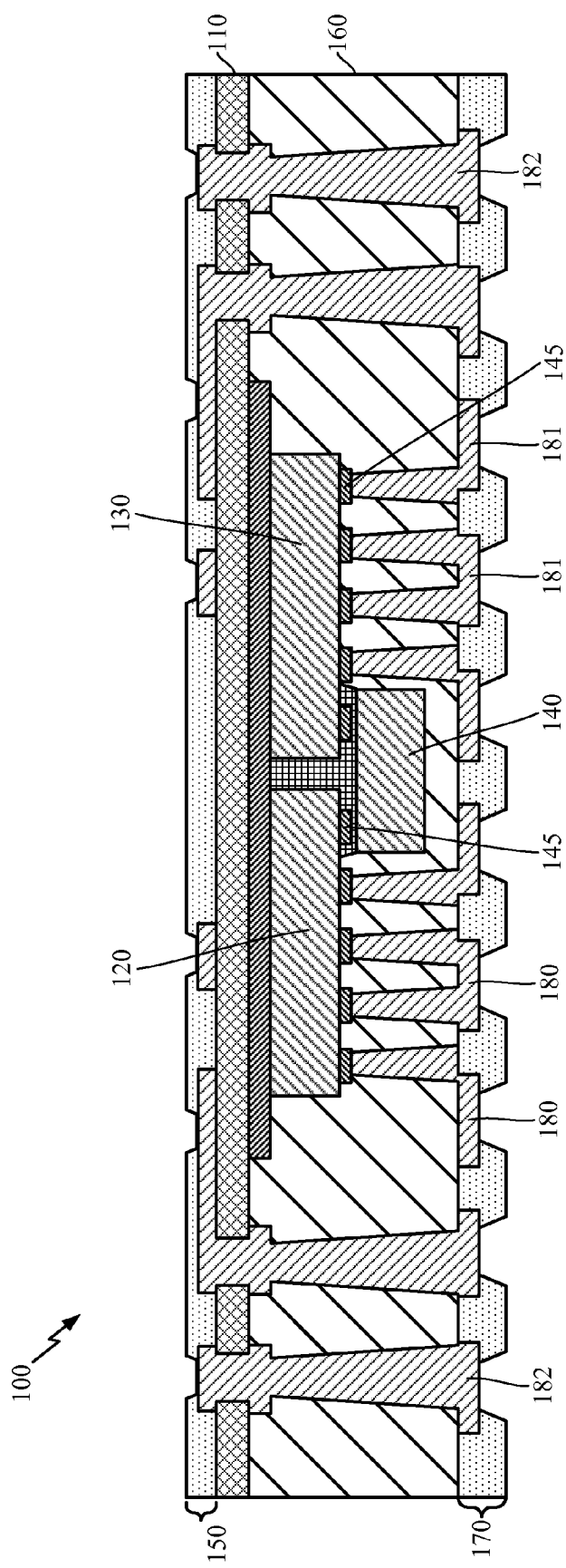
FIG. 1 depicts an exemplary semiconductor package with a bridge interposer and die vias.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address shortcomings of conventional methods and structures by providing a semiconductor package for side by side die that obviates the need for large landing pads or an internal RDL layer in the substrate to connect the side by side die. The large landing pads are not necessary because the placement accuracy of the die placement process is increased by placing the logic or memory die first and then placing an interposer on top of the side by side die before embedding the interposer in a package substrate. With the increased placement accuracy, the required width of the landing pads may be reduced, which will allow closer L/S spacing in the interposer. With the use of smaller landing pads, an internal substrate RDL is not required to accommodate the necessary routing density because the interposer can handle a more density routing without the need for a second or additional internal substrate RDL layer.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

FIG. 1 depicts a semiconductor package with an interposer and die vias according to some examples of the disclosure. As shown in FIG. 1, a semiconductor package 100 may include a base 110 having a first side and a second side opposite the first side, a first die 120 located on the second side of the base 110, a second die 130 located on the second side of the base and spaced horizontally from the first die 120, and an interposer 140 located on one side of the first die 120 and second die 130 opposite the base 110. The interposer 140 may be horizontally centered between the first die 120 and the second die 130 and sized to overlap an edge of the first die 120 and an edge of the second die 130. The interposer 140 may be connected to the first die 120 and the second die 130 through thirty μm wide landing pads 145. The interposer 140 providing routing paths that allow the first die 120 to communicate or send signals to the second die 130 with a low profile of only thirty μm thickness in the vertical direction. The first die 120 and the second die 130 each may have an active side facing away from the base 110 and towards the interposer 140. The interposer 140 may have an active side that faces the first die 120, second die 130, and base 110. The landing pads 145 may connect the active sides of the first die 120 and second die 130 with the active side of the interposer 140. The first die 120 and the second die 130 may be a number of different semiconductor devices, such as a logic die or a memory die.

The semiconductor package 100 may include a first RDL 150 located on the first side of the base 110. The first RDL 150 may provide an external connection for the semiconductor package to couple the base and the routing within the first RDL 150 with an external device, such as another semiconductor package, a discrete logic device, and another die. The semiconductor package 100 may include an encapsulation layer 160 on the second side of the base 110 that encapsulates the second side of the base 110, the first die 120, the second die 130, and the interposer 140. The encapsulation layer 160 in conjunction with the base 110 may provide a package structure for the semiconductor package 100. The encapsulation layer 160 may comprise non-conductive, moldable material.

The semiconductor package 100 may include a second RDL 170 on a surface of the encapsulation layer 160 opposite from the first RDL 150. The second RDL 170 may provide an external connection for the semiconductor package to couple the package with an external device or structure, such as a printed circuit board. The semiconductor package 100 may include a first plurality of vias 180 extending from the active side of the first die 120 through the encapsulation layer 160 to the second RDL 170, a second plurality of vias 181 extending from the active side of the second die 130 through the encapsulation layer 160 to the second RDL 170, and a third plurality of vias 182 extending from the first RDL 150 through the encapsulation layer 160 to the second RDL 170. The first plurality of vias 180 and the second plurality of vias 181 provide an interconnection from the first die 120 and the second die 130 respectively to the second RDL 170. The third plurality of vias 182 provides an interconnection from the first RDL 150 to the second RDL 170. The vias may be filled with any conductive material, such as metal or metal alloys. The total thickness of semiconductor package 100 with the first RDL 150 and second RDL 170 may be less than 0.5 millimeters.

Figure 2A:
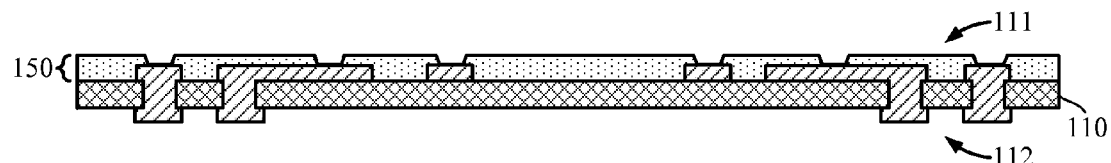
FIGS. 2A-G depicts an exemplary process for making a semiconductor package with a bridge interposer and die vias.

FIGS. 2A-G depict a partial exemplary fabrication process for a semiconductor package with an interposer and die vias. As shown in FIG. 2A, the partial process flow for fabrication a semiconductor package 100 begins with a base 110 having a first side 111 and a second side 112 opposite the first side 111, and a first RDL 150 located on the first side 111 of base 110. The first RDL 150 may include routing interconnections configured for connection to an external device. The first RDL 150 includes routing that connects the first side 111 of the base 110 with the second side 112 of the base 110.

Figure 2B:
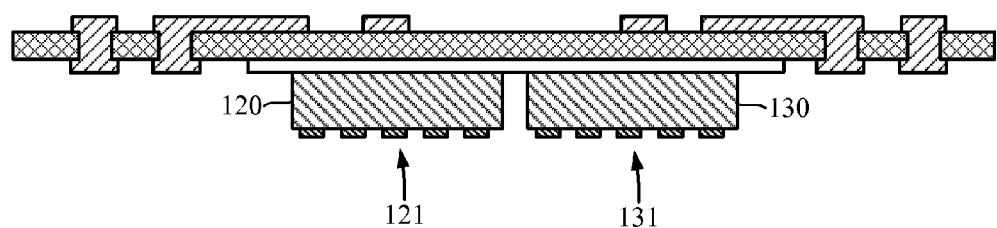

As shown in FIG. 2B, the process continues with the attachment of a first die 120 with an active side 121 and a second die 130 with an active side 131. The first die 120 and second die 130 are attached to the second side 112 of the base 110 such that the active sides 121 and 131 face away from the base 110. The first and second dies 120 and 130 may be attached to the base using an adhesive or similar material.

Figure 2C:
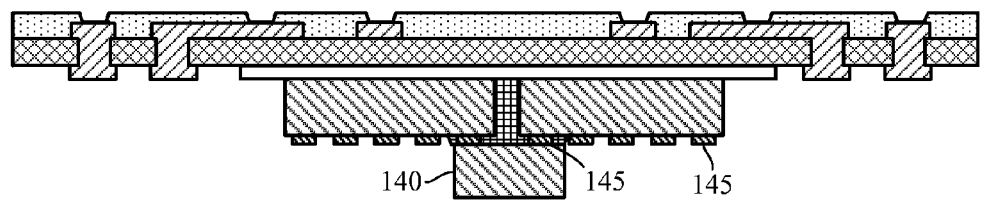

As shown in FIG. 2C, the process continues with the addition of landing pads 145 and the attachment of an interposer 140. Interposer 140 may be low profile, approximately 30 μm thick in the vertical direction. The interposer 140 may include an active side and internal routing paths that connect a region of the active side with other regions of the active side. The landing pads 145 are formed at locations on the active side of the first die 120 and the second die 130 and may have a width of approximately 30 μm. The landing pads may be composed of any electrically conductive material, such as a metal or metal alloy. Because the interposer is not first embedded in a substrate of the package before the die are aligned and attached, the placement accuracy of the process can be reduced to an error of approximately 2 μm. The active side of the interposer 140 is attached to the active sides of the first die 120 and the second die 130 at landing pads 145 near edges of the first die 120 and the second die 130 such that the interposer 140 is centered over the gap between the first die 120 and second the die 130 and partially overlaps the edges of the first and second dies 120 and 130. The interposer 140 may be attached using a thermo-compression bonding (TCB) or a mass reflow (MR) process. Once attached, an under-fill material may be added in the gaps between the first and second dies 120 and 130 as well as interposer 140.

Figure 2D:
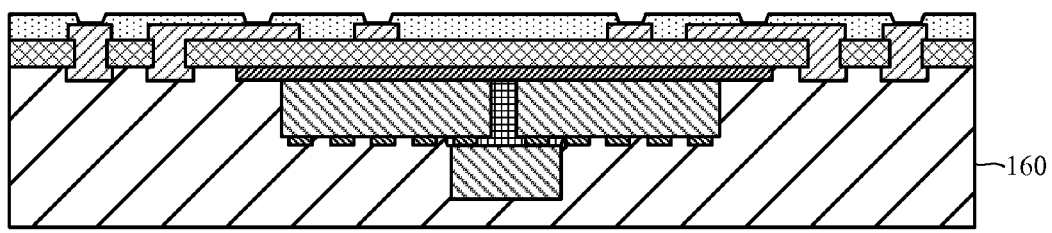

As shown in FIG. 2D, the process continues with the addition of an encapsulation layer 160. An encapsulation material may be applied to the base 110, first die 120, second die 130, and interposer 140 to encapsulate these components and form part of the semiconductor packaging with base 110. The encapsulation material may be applied in a lamination process and may be composed of a photo-patternable material.

Figure 2E:
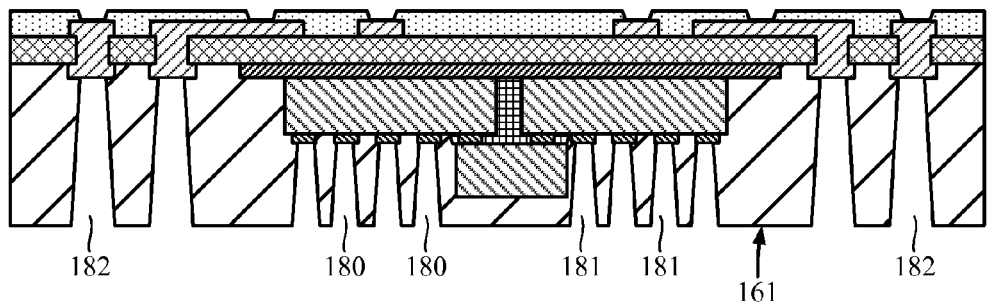

As shown in FIG. 2E, the process continues with the formation of vias. The encapsulation layer 160 is patterned and exposed to a lithography process to form a first plurality of vias 180, a second plurality of vias 181, and a third plurality of vias 182. The first plurality of vias 180 extends from a surface 161 of the encapsulation layer 160 to the landing pads 145 on the active side of the first die 120. The second plurality of vias 181 extends from the surface 161 of the encapsulation layer 160 to the landing pads 145 on the active side of the second die 130. The third plurality of vias 182 extends from the second side 112 of base 110 completely through the encapsulation layer 160 to the surface 161.

Figure 2F:
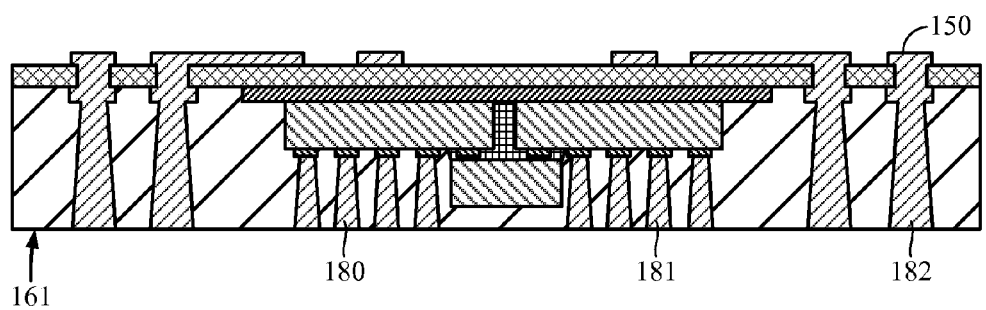

As shown in FIG. 2F, the process continues with filling the vias just created. The first plurality of vias 180, the second plurality of vias 181, and the third plurality of vias 182 are filled with an electrically conductive material, such as metal or a metal alloy. The filling process may use a paste plugging process for a solid fill, a plug process for inserting a conformal barrel shape into the via, or similar methods. By filing the vias with electrically conductive material, an interconnection is formed from the first RDL 150 to the surface of the encapsulation layer 160 by the third plurality of vias 182, from the first die 120 to the surface of the encapsulation layer 160 by the first plurality of vias 180, and from the second die 130 to the surface of the encapsulation layer 160 by the second plurality of vias 182.

Figure 2G:
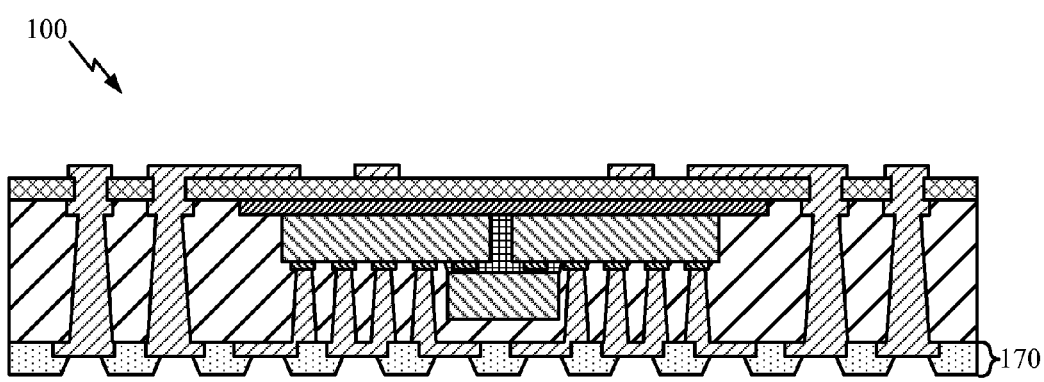

As shown in FIG. 2G, the process continues with the formation of a second RDL 170. The surface 161 of the encapsulation layer 160 may be treated with a photo-imageable material and patterned to form a second redistribution layer 170. The patterned layer is then exposed and a plating process is applied to fill the resultant voids with routing and landing pads for connection to external devices, such as a ball grid array. The second redistribution layer may be patterned to create a desired fan in (or fan out) configuration based on the anticipated external device. The second redistribution layer may be electrically connected to the first die 120 by the first plurality of vias 180, to the second die 130 by the second plurality of vias 181, and to the first redistribution layer 150 by the third plurality of vias 182.

Examples of the methods, apparatus, and systems described herein can be used in a number of applications. For example, the described examples could be used in split die semiconductor packages including 2.5D/3D flip chip chip scale package (FCCSP), and flip chip ball grid array (FCBGA). Further applications should be readily apparent to those of ordinary skill in the art.

Nothing stated or illustrated depicted in this application is intended to dedicate any component, step, feature, benefit, advantage, or equivalent to the public, regardless of whether the component, step, feature, benefit, advantage, or the equivalent is recited in the claims.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A semiconductor package, comprising:
a base having a first side and a second side opposite the first side;
a first redistribution layer on the first side of the base, the first redistribution layer configured to couple the base with an external device;
a first die attached to the second side of the base with an active side of the first die facing away from the base;
a second die attached to the second side of the base adjacent the first die with an active side of the second die facing away from the base;
an interposer attached to the active side of the first die and the active side of the second die;
an encapsulation layer encapsulating the second side of the base, the first die, the second die, and the interposer;
a first plurality of vias coupled to the first die;
a second plurality of vias coupled to the second die, the first plurality of vias and the second plurality of vias extending partially through the encapsulation layer; and
a third plurality of vias extending through the encapsulation layer and the base.

2. The semiconductor package of claim 1, wherein the interposer is less than 30 um in thickness.

3. The semiconductor package of claim 1, wherein the encapsulation layer comprises a photo-patternable material.

4. The semiconductor package of claim 1, further comprising a second redistribution layer on a surface of the encapsulation layer opposite the base, the second redistribution layer electrically connected to the third plurality of vias to provide a change in an interconnect pattern.

5. The semiconductor package of claim 4, wherein the third plurality of vias connects the first redistribution layer and the second redistribution layer.

6. The semiconductor package of claim 4, wherein the second redistribution layer is configured for a connection to a ball grid array (BGA).

7. The semiconductor package of claim 4, wherein the first plurality of vias connects the first die and the second redistribution layer.

8. The semiconductor package of claim 4, wherein the second plurality of vias connects the second die and the second redistribution layer.

9. The semiconductor package of claim 4, further comprising a plurality of landing pads on the active side of the first die and the active side of the second die.

10. The semiconductor package of the claim 9, wherein each of the plurality of landing pads has a horizontal width of approximately 30 μm.

11. The semiconductor package of claim 10, wherein the interposer further comprises internal routing pathways that electrically connect the first die with the second die.

12. The semiconductor package of claim 11, wherein the first die is spaced horizontally from the second die creating a gap and the interposer is centered over the gap while overlapping an edge of the first die and an edge of the second die.

13. A semiconductor package on package structure, comprising:
a base having a first side and a second side opposite the first side;
a first redistribution layer on the first side of the base, the first redistribution layer configured to couple the base with a second semiconductor package;
a first die attached to the second side of the base with an active side of the first die facing away from the base;
a second die attached to the second side of the base adjacent the first die with an active side of the second die facing away from the base;
an interposer with internal routing pathways, the interposer attached to the active side of the first die and the active side of the second die;
an encapsulation layer encapsulating the second side of the base, the first die, the second die, and the interposer;
a first plurality of vias coupled to the first die;
a second plurality of vias coupled to the second die, the first plurality of vias and the second plurality of vias extending partially through the encapsulation layer; and
a third plurality of vias extending through the encapsulation layer and the base.

14. The semiconductor package on package structure of claim 13, wherein the internal routing pathways electrically connects the first die with the second die.

15. A semiconductor package, comprising:
a base having a bottom and a top opposite the bottom;
a first redistribution layer on the bottom of the base, the first redistribution layer configured to couple the base with an external device;
a first die attached to the top of the base with an active side of the first die facing away from the base;
a second die attached to the top of the base adjacent the first die with an active side of the second die facing away from the base;
an interposer attached to the active side of the first die and the active side of the second die;
an encapsulation layer encapsulating the top of the base, the first die, the second die, and the interposer;
a first plurality of vias extending from the first die to a surface of the encapsulation layer;
a second plurality of vias extending from the second die to the surface of the encapsulation layer; and
a third plurality of vias extending from the surface of the encapsulation layer and the bottom of the base.

16. The semiconductor package of claim 15, wherein the interposer is less than 30 um in thickness.

17. The semiconductor package of claim 15, wherein the encapsulation layer comprises a photo-patternable material.

18. The semiconductor package of claim 15, further comprising a second redistribution layer on the surface of the encapsulation layer opposite the base, the second redistribution layer electrically connected to the third plurality of vias to provide a change in an interconnect pattern.

19. The semiconductor package of claim 18, wherein the third plurality of vias connects the first redistribution layer and the second redistribution layer.

20. The semiconductor package of claim 18, wherein the second redistribution layer is configured for a connection to a ball grid array (BGA).

21. The semiconductor package of claim 18, wherein the first plurality of vias connects the first die and the second redistribution layer.

22. The semiconductor package of claim 18, wherein the second plurality of vias connects the second die and the second redistribution layer.

23. The semiconductor package of claim 18, further comprising a plurality of landing pads on the active side of the first die and the active side of the second die.

24. The semiconductor package of claim 23, wherein the interposer further comprises:
   internal routing pathways that electrically connect the first die with the second die; and
   wherein the first die is spaced horizontally from the second die creating a gap and the interposer is centered over the gap while overlapping an edge of the first die and an edge of the second die.

25. A method of forming a semiconductor package, the method comprising:
   forming a base with a first side and a second side opposite the first side, the base having a first redistribution layer on the first side of the base configured to provide a connection from the first side to the second side;
   attaching a first die to the second side of the base with an active side of the first die facing away from the base;
   attaching a second die to the second side of the base adjacent the first die with an active side of the second die facing away from the base;
   attaching an interposer to the active sides of the first die and the second die to interconnect the first die and the second die;
   applying a encapsulating material to encapsulate the second side of the base, the first die, the second die, and the interposer, the encapsulating material and the base forming a package substrate;
   forming a first plurality of vias extending partially through the encapsulating material to provide external connections to the first die;
   forming a second plurality of vias extending partially through the encapsulating material to provide external connections to the second die; and
   forming a third plurality of vias extending through the encapsulating material and the base.

26. The method of claim 25, wherein the interposer is less than 30 um in thickness.

27. The method of claim 25, wherein the encapsulating material is a photo-patternable material.

28. The method of claim 25, further comprising forming a second redistribution layer electrically connected to the third plurality of vias to provide an change in an interconnect pattern.

29. The method of claim 28, wherein the third plurality of vias connects the first redistribution layer and the second redistribution layer.

30. The method of claim 28, wherein the second redistribution layer is configured for a connection to a ball grid array (BGA).

* * * * *